ELECTRIC CIRCUIT PANELBOARD

Filed Oct. 12, 1955

INVENTOR.
HOWARD W. ECKER
BY
Carpenter, Abbott, Coulter, Kinney
ATTORNEYS

United States Patent Office 3,133,773

Patented May 19, 1964

3,133,773

ELECTRIC CIRCUIT PANELBOARD

Howard W. Ecker, St. Paul, Minn., assignor to Minnesota Mining & Manufacturing Company, St. Paul, Minn., a corporation of Delaware Filed Oct. 12, 1955, Ser. No. 540,027
6 Claims. (Cl. 339—17)

The present invention relates generally to electrical circuit panelboards. More particularly, my invention relates to internal-conductor electrical circuit panelboards each containing, after manufacture thereof, a vast number of potential circuit layouts, one or more of which may be simply and quickly made operative; to the means by which conductive connections are made in realizing potential circuits in the panelboards; and to panelboards on which connections have been made.

In the electronics industry it is often necessary or desirable to place the various electrical components, such as transistors, resistors, capacitors, etc., in close compact relationship. Loose wire connections, that is where the terminal of one component is connected to a terminal of another component through a single wire conductor supported mainly at the connections, are to be avoided in the interest of minimum error, simplicity and space saving. It is therefore common practice in the electronics industry and, indeed, in the electrical industry generally, to obviate loose wire connections by mounting a plurality of electrical apparatus units or components on a common panel of an insulating material, with the terminals of the components being interconnected in accordance with a predetermined circuit layout by means of thin connecting electrical conductors adhered to the panel surface according to the said predetermined plan. Where the circuit is a complicated one, thin conductors are often adhered in the proper connecting position to both sides of the insulating panel according to a predetermined arrangement with the conductors on opposite surfaces of the panel being connected at the desired points by means of rivets or similar connecting members which extend through the panel.

Such prior art panels are commonly formed by printing or developing an acid-resistant image on the metallized surface of an insulating panel and then etching away metal not protected by the image leaving the desired conductor configuration adhered to the surface. They are, by their very nature, suitable for only a single electrical circuit layout. Hence, it has in the past been necessary for manufacturers or suppliers in the electronics and electrical industries to carry predetermined circuit panelboards in stock for a variety of circuits.

In advance fields of electronics, such as, for example, in ultra high frequency radio or in guided missiles, it is often desirable to alter a circuit slightly by adding resistance, inductance or capacitance to a previously set up circuit in order to provide a circuit which will desirably and accurately balance and cooperate with other circuits to which it is connected. Where a prior art circuit panelboard has been employed having a predetermined layout, components in addition to those originally provided for may not be attached except through loose wire connections. The only manner in which an additional component may be supplied to such a panel without the use of cumbersome loose wire connections, is by the replacement of a component already attached.

Prior art circuit panelboards having a single available predetermined circuit are also unsuitable in fields where electronic or electrical circuit planning and development are carried out, such as in the development laboratories of industrial plants, or in repair shops or home workshops. In these, radical alteration of basic circuits is commonplace. However, in such operation it is also highly desirable to avoid, if possible, the necessity of heretofore employed complex and cumbersome loose wire connections.

It is therefore an object of the present invention to provide a completed electrical circuit panelboard which is not restricted to a predetermined electrical layout, thus permitting identical panelboards to be employed in electrical and electronic uses requiring individually different electrical circuit plans.

An additional object of the present invention is to provide an electrical circuit panelboard in which a circuit layout once selected and made operative may be simply and conveniently altered either radically or to permit installation of additional components so as to balance up the original circuit.

Still another object of the present invention is to provide an electrical panelboard in which a desired circuit plan may be realized through simple conductor connection and other simply performed operations without necessity of extensive manufacturing equipment.

Still another object of my invention is to provide means for conveniently and easily making desired connections in the electrical circuit panelboard hereof in making operative circuits therein.

Another object of my novel invention is to provide a circuit panelboard which is easily and comparatively inexpensively manufactured.

Still another object of the present invention is to provide a circuit panelboard in which disadvantages presented by exposed conductors are obviated.

Heretofore, suggestion has been made to the provision of surface-conductor electrical circuit panelboards which are not restricted to a predetermined circuit layout. Such a panelboard consists of an insulating panel having a sheet or strips of metal foil adhered to one or both surfaces thereof. The desired electrical circuit layout is then formed on the panel by cutting the metal foil into the desired configuration and removing the undesired metal portions. However, once the die-cut configuration is formed, the panelboard in essence becomes one having a circuit layout of predetermined nature for it cannot thereafter be altered to any significant degree.

To my knowledge, no one heretofore has appreciated that an internal conductor-carrying electrical circuit panelboard could exist which, after manufacture thereof, in no way is restricted to a predetermined circuit layout. Not only have I provided such a panelboard, but one which, in addition, is not even restricted to the basic circuit layout selected and made operative; rather my panelboard may be basically altered thereafter one or more times to provide substantially any different circuit layout desired.

In order that the present invention may be more fully described, attention is now directed to the accompanied drawings wherein like reference characters refer to similar parts throughout the several views, in which.

Figure 1:
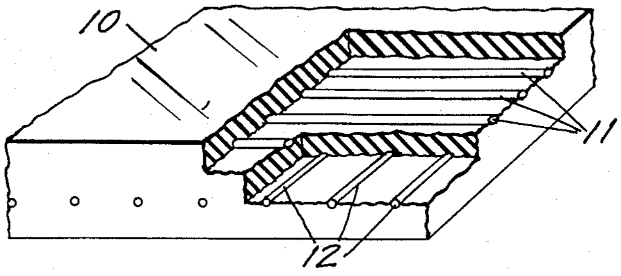
FIGURE 1 is a perspective view partially in section of a portion of one embodiment of a circuit panelboard of the present invention.

Referring now to FIGURE 1, the circuit panelboard shown comprises a panel 10 composed of insulating material which has embedded therein a first series of elongate conductors 11 disposed in parallel predetermined uniform spaced relation in a plane parallel with the major surfaces of the panel. A second series of elongate conductors 12 disposed in parallel predetermined uniform spaced relation extends within the panel 10 at an angle of 90 degrees with respect to the conductors 11 of the first series. The conductors 12 of the second series define a plane parallel and spaced from the plane defined by the conductors 11 of the first series, the two planes being sufficiently spaced that conductors 11 are insulated from the conductors 12 at points of crossing. A typical circuit panelboard of the present invention suited for use in, for example, electronic computers employs No. 24 AWG copper conductor wire spaced on 0.10 inch centers and has a thickness of about 1/16 inch.

Figure 2:
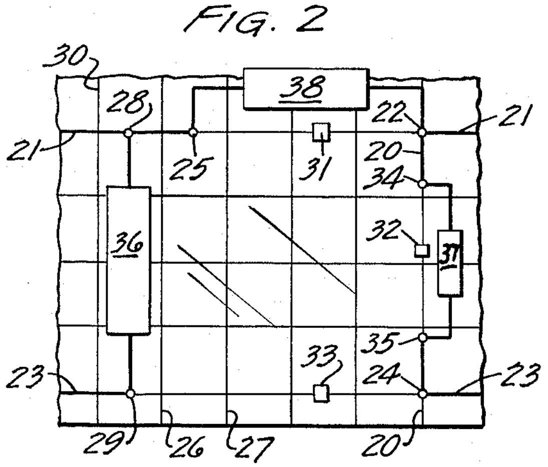
FIGURE 2 is a plan view of a circuit panelboard with electrical components attached in which a circuit layout has been selected and made operative.

In FIGURE 2 an electronic coupling composed of one capacitor and two resistors is installed employing conductors of my circuit panelboard for the proper connections therebetween. Conductor 20 is conductively connected to conductor 21 by the insertion of a connecting member 22 into the panelboard at a point where both conductors 20 and 21 are contacted thereby, i.e. at the point of crossing of conductors 20 and 21, in a manner to be hereinafter described. Conductor 20 is similarly conductively connected to conductor 23, which extends parallel to conductor 21, by the proper insertion of connecting member 24. A connecting member 25 is inserted in the panelboard so as to conductively engage conductor 21 at a position intermediate (thus not in contact with) conductors 26 and 27. A pair of similar connecting members 28 and 29 are inserted in engagement with conductors 21 and 23 respectively, intermediate conductors 26 and 30. The conductive continuity of conductor 21 is broken at a point 31 intermediate the position of member 25 and conductor 20 in the manner to be hereinafter described. Similarly, the conductive continuity of conductors 20 and 23 is broken at points 32 and 33 respectively, as shown. Connecting members 34 and 35 are inserted in the panelboard in engagement with conductor 20 between conductors 21 and 23 on opposite sides of the break 32 and at a position where conductors of the series parallel with conductors 21 and 23 are not contacted.

Electrical components are attached to the panelboard to complete the electronic coupling. The two terminal wires of a resistor 36 are inserted into connecting members 28 and 29 and the terminal wires of a similar type resistor 37 are inserted into connecting members 34 and 35. The terminal wires of a capacitor 38 are inserted into connecting members 25 and 22. The several component terminals are then soldered in their respective positions, e.g. by immersion of the panelboard in a molten solder bath for a few seconds to allow molten solder to flow about the joints followed by removal from the bath to permit the solder deposited in the joints to solidify.

The panel in which the conductors are embedded firmly retains the latter against undesired displacement. I have found this to be a requisite feature of my novel panelboard in order to ensure permanent positioning of the conductors during drilling or punching of the board, insertion of connecting members, and attaching of circuit components. It is highly essential that my panelboard be of a nature that conductive connections may be permanently made.

I have found various resinous materials, of both a thermoplastic and thermosetting nature, to be most satisfactory for use as the panel member in which the conductors are embedded. Such materials not only are adapted to the formation of panels which indisplaceably retain conductors embedded therein, but also are inherently nonconductive and exhibit other desirable advantages as well. For example, many are translucent or nearly transparent when in the form of relatively thin panels such as are contemplated in the present invention. Thus, the position of the several conductors is readily visually ascertained thereby facilitating the determination of the exact location where connections and breaks are to be effected. When employing resinous materials, my panelboard is preferably formed of a laminar structure, several superpositioned layers of thin resinous sheet material being laid up with the conductors properly positioned between layers, the unification of the structure being subsequently accomplished by curing or heat-sealing of the resinous material under pressure.

Figure 3:
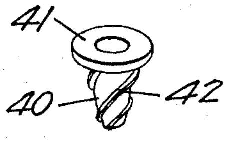
FIGURE 3 is a view in perspective of a connecting member employed in making a circuit layout operative in my panelboard.

The means by which connections (both internal and external) are made in the panelboard may be realized in several ways. In FIGURE 3 a preferred connecting means in the form of a hollow threaded rivet member is illustrated. The member consists of a hollow tapered shank portion 40, a flange 41 at the wide end of the shank serving as a head and a helical screw thread 42 of relatively high pitch formed along the exterior of the shank 40, the latter causing the rivet to rotate upon being forced into position, e.g. by the blow of a hammer. The rivet is constructed of a material such as brass, which is electrically conductive and is sufficiently rigid to permit driving into the panel without deformation.

Figure 4:
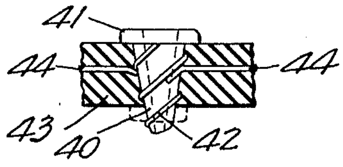
FIGURE 4 is a view partially in section showing the connecting member of FIGURE 3 in position in a circuit panelboard.

The connecting member rivet of FIGURE 3 is inserted into the panelboard in the position shown in FIGURE 4 in the following manner. Preferably, though not necessarily, the panelboard is drilled or punched to form a small pilot hole, and at the same time to expose a portion of the conductor or conductors sought to be connected. The rivet is then inserted, small end first, into the pilot hole and driven into position by the blow of a hammer or by the pressing action of a pair of pliers or press. As the rivet proceeds downwardly into the panelboard, thread 42 engages the resinous material 43 and causes the rivet to be rotated slightly before coming to rest in final inserted position. The resinous material bears tightly against the rivet thereby firmly retaining it in position as it is forced into the panelboard. The severed ends of conductor 44 are also engaged by the thread 42 and wrapped partially around the rivet in tight conductive contact therewith. If desired, the small end of the rivet extending through the panelboard may be upset (as shown by the broken lines) to "lock" the rivet irremovably in position. Alternatively, a film of solder may be applied to the surfaces of the rivet (commonly known as "tinning") prior to insertion followed by application of heat thereto after insertion thereby causing solder to flow and adhere to conductor surfaces contacted by the rivet.

Where it is desired to conductively connect an exterior conductor, such as a terminal conductor of an electrical component, with the internal conductor or conductors engaged by the connective rivet, the exterior conductor is inserted into the hollow portion of the rivet shank 40 and there affixed, e.g. soldered.

I have found the above described high pitch rivet to provide excellent conductive connections between crossing conductors of my panelboard. The thread engages each of the conductors firmly and permanently. Further, the rivet need not be perfectly placed in order to insure a good conductive connection. In fact, even where the rivet has been inserted away from the desired point of insertion such that only the thread engages the conductor or conductors to be connected, a highly satisfactory electrical connection is still obtained, Although I prefer at present to employ high pitch rivets in making various circuit connections in the electrical circuit panelboard hereof, other types of connections may be made which are also satisfactory. For example, suitable conductive connections may be made to the internally carried conductors of my panelboard or with external electrical components by inserting non-threaded rivets or by drilling or punching the panelboard so as to expose the conductor or conductors to be connected and then filling the aperture formed with molten solder which becomes adhered to the conductors to be connected. To ensure that a good conductive connection is made, it is desirable to apply an appropriate type of solder flux to the conductor ends prior to soldering.

The continuity of a conductor is conveniently broken, as at points 31, 32 and 33 in FIGURE 2, by drilling or punching the panelboard and conductor so as to completely sever the conductor and remove a portion thereof. Although the size or length of conductor removed is not critical normally, it must be borne in mind that where the entire panel is to be immersed in a solder-bath for the purpose of soldering joints in attaching electrical components to the panel, care must be taken to prevent solder from bridging the gap and thus reconnecting the severed conductor. This may be accomplished by removing a sufficient portion of conductor such that the gap created cannot be bridged by the molten solder. Another method for preventing solder bridging is the application of a material which prevents solder adhesion, such as a slight film of oil or grease or a plug of resin.

Not only may any one of a very large number of possible circuit layouts be realized in my novel panelboard by appropriately connecting crossing conductors and disrupting the continuity of conductors as desired, but also the circuit layout may, in most instances, be simply and conveniently altered even after such circuit layout has been effectuated and the electrical components installed. This feature of my invention renders the panelboard hereof particularly suitable in electronic applications where the highest degree of accuracy and balance in electrical circuits is essential. In such applications, each complete circuit must be tested after the electrical components have been installed. Where a circuit is found to be deficient, for example, in the amount of required resistance, the panelboard circuit must either be altered or discarded or a resistor replaced. Where my panelboard has been employed, discarding or replacement is unnecessary, for the deficiency is easily remedied.

Figure 5:
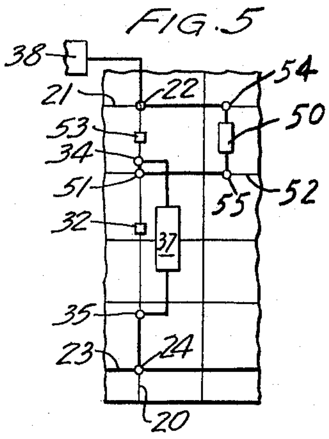
FIGURE 5 is a plan view of a portion of the panelboard of FIGURE 2 after alteration of the circuit thereof.

The manner in which the circuit layout of my panelboard is altered to correct deficiency after the electrical components have been installed is illustrated in FIGURE 5. Where, for example, the resistor 37 of FIGURE 2 is found to provide insufficient resistance, a suitable further resistor 50 is added in series connection with resistor 37 to increase the total resistance of this portion of the circuit to the desired level. A connecting member 51 is inserted at the point where conductor 20 crosses conductor 52 so as to conductively connect the two. The conductive continuity of conductor 20 is then broken at a point 53 between conductors 21 and 52. Connecting members 54 and 55 are then inserted into the panelboard so as to conductively engage only conductors 21 and 52, respectively. The terminal conductors of the resistor 50 are finally conductively connected to members 54 and 55 to complete the alteration circuit.

If it be found that the resistor 37 of the coupling circuit illustrated in FIGURE 2 contains excessive resistance, the resistance of that portion of the circuit is reduced by installation of an additional resistor of the desired predetermined resistance in parallel connection with resistor 37 by making appropriate conductive connections and disruptions in the panelboard.

In addition to being able to alter a circuit layout in order to properly remedy a deficiency in one or more of the electrical components attached thereto, the basic circuit layout chosen may also be simply and conveniently changed in the novel panelboard hereof. For example, should it be desired, for one reason or another, to remove the resistor 37 of FIGURE 2, and restore conductive continuity in conductor 20 to provide a conductive path between conductors 21 and 23, a connecting member such as the rivet of FIGURE 3 is simply inserted into the panel at the point of disruption 32 of conductor 20 to "bridge" the disruption and connect the severed ends of the conductor. Thus the electrical circuit panelboard hereof is particularly useful in repair shops or home work shops where electrical circuit development or repair is often of a sort that cannot be performed on circuit panelboards having a single predetermined layout.

To the best of my knowledge, no one has, prior to the present invention, provided an electrical circuit panelboard in which the basic circuit layout could be changed or to which electrical components in addition to that number originally contemplated in the circuit could be installed by simple, quickly performed procedures, as with the product of the present invention, so as to correct circuit deficiencies without the necessity of loose wire connections. However, many such changes may be effected on my panelboard, it being apparent that the number of possible changes or alterations is limited only by the size of the panelboard itself, the number of conductors carried thereby and the spacing between conductors.

In my panelboard the conductors are completely embedded and retained from longitudinal displacement in the resinous panel. They are also substantially unexposed to the air. Hence, difficulties experienced by reason of exposure of conductors are obviated. For example, surface leakage between adjacent conductors does not occur. Moreover, inadvertent short-circuiting, always a possibility where conductors are exposed, is greatly minimized.

Figure 6:
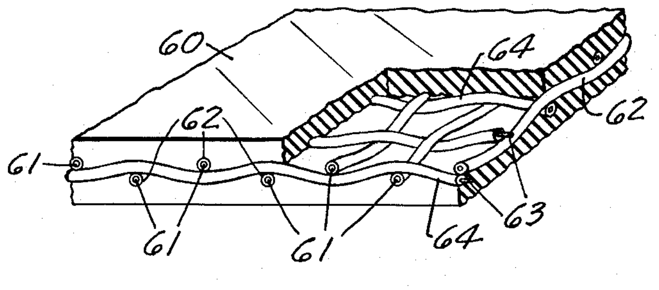
FIGURE 6 is a perspective view partially in section of an alternative embodiment of my novel electrical circuit panelboard.

An alternative embodiment of my novel electrical circuit panelboard is shown in FIGURE 6. A panel 60 of insulating material has embedded therein a pre-formed woven mesh member consisting of a first series of generally parallel and uniformly spaced conductors 61, each of which is encased in a continuous insulating covering 62, and a second series of conductors 63 extending at an angle of 90 degrees with conductors 61 of the first series and interwoven therewith in a plain weave as shown. To insure against inadvertent conductive contact between crossing conductors by reason of a rupture in the covering 62 around conductors 61, conductors 63 of the second series are also encased within a continuous insulating covering 64. Although the conductors in the structure shown are interwoven in a plain weave, it is apparent that the series of parallel conductors of the pre-formed mesh member may be interwoven in any manner which provides a stable structure of proper conductor alignment, etc., and which may be handled during the manufacture of the panelboards without displacement of the conductors.

The insulating coverings 62, 64 will ordinarily be applied around the conductors before the latter are woven or meshed together and hence should normally be flexible. Insulated copper wire carrying an insulating covering of cotton or other filamentary material may be used. Enameled wire is also suitable. The coating should retain its identity during combination of the woven screen with the resinous or other insulating material of the board 60 in order to prevent contact between crossing wires.

Having now generally described my novel invention and by means of illustrations demonstrated a few of the many uses to which it may be put, the following specific examples will describe salient embodiments of the product and illustrative methods by which these constructions may be manufactured.

*Example I*

A lineally aligned glass filament reinforced heat-curable resinous sheet was first prepared in the following manner. One hundred parts of an epoxy resin, a reaction product of bisphenol A and epichlorohydrin, having a melting point of 40°–45° C. as determined by the Durrans Mercury Method and an epoxide equivalency of about 0.29 per 100 grams of resin, and 15 parts of diallylmelamine were intimately blended and heated to a temperature of about 95° C. in a dip pan at which temperature the blend had the consistency of a syrupy liquid. A large number of lineally aligned contiguous glass strands were drawn continuously from warp beams and led through condensing combs where they were concentrated to about 200 ends per inch. Each strand contained 204 untwisted or highly twisted filaments of 0.00038 inch diameter. The strands were continuously drawn under uniform tension through the resin contained in the dip pan at a feed rate of about four yards per minute and then passed through squeeze rolls to shape the reinforced web thus created into a 0.010 inch thick sheet comprised of about 55 percent by weight of the glass filaments. The resin in the web, upon leaving the rolls, quickly cooled to a handleable slightly tacky surface-condition.

The reinforcing sheet thus prepared was cut into several sheets having dimensions of 12 inches on a side. Two sheets were laid in superimposed relation with the reinforcing filaments of the first sheet extending transversely to the filaments of the second sheet. A warp of tinned No. 24 AWG (0.020 inch diameter) wires uniformly spaced on 5/32 inch centers retained on a frame under uniform tension was laid on the top (second) layer of reinforced sheet material with the wires extending at right angles with respect to the filament direction of the second sheet. An additional layer of the reinforced sheet material was laid, over the parallel wires in register with the first two sheets with the direction of the aligned filaments of the added sheet running parallel with respect to that of the second sheet. A fourth layer of the sheet material was laid in superposition with the reinforcing filaments extending 90° with respect to those of the third layer. A similar warp having parallel wires of identical size and spacing as that of the first mentioned warp was placed on the fourth layer of sheet material with the wires extending 90° with respect to the wires previously laid. An additional two layers of the reinforced sheet material were then laid in superposition over the second warp with the direction of the filaments the fifth sheet extending transversely to the wire direction of the second warp and that of the filaments of the last sheet extending at right angles to the filaments of the fifth sheet.

The laminar structure was then unified in a platen press previously heated to 165° C., low adhesion liner sheets of polyethylene treated Kraft paper being positioned between the structure and the platens. Cure of the resin was effected first by heat alone for a period of 4 minutes to permit the resin to reach a gell stage after initially melting, followed by the application of 25 pounds per square inch pressure (the platen temperature remained at 165° C.) for 20 additional minutes. The press was then opened and the laminar structure removed and allowed to cool. The liner sheets were then removed, the wires cut free of the frames and panels of the desired shape and size were cut from the resulting unified structure.

The resulting 1/16 inch thick panelboards were observed to be hard and tough and provided highly suitable electrical circuit panelboards. The embedded conductor-wires were readily visible through the resinous insulating material. When the panel was punched or drilled through at points where conductors were positioned, portions of the same were removed without displacement of remaining portions of the conductors. Good, permanent electrical connections between crossing internal conductors, and severance of conductors, were simply effected in the panelboards as previously suggested, to provide a wide variety of electrical circuits.

Although the direction of the conductors of the present example was at an angle with that of the glass filaments of reinforced sheet layers immediately adjacent thereto in the structure, the structure may also be laid up such that the directions are parallel. However, in such case the conductors, upon pressing of the structure, are impressed between (rather than across) filaments and occasionally are thereby slightly altered laterally in position thus causing the spacing between conductors to be non-uniform.

The preformed reinforced sheet material may also be formed containing as a part thereof the parallel conductors positioned in the proper spaced relation. This is accomplished by replacing glass strands at the desired intervals with conductor wires during the formation of the reinforced sheet material in the manner previously described. When such a sheet is used, the separate steps of properly placing the series of conductors between layers of resinous sheet material are obviated, the structure then being formed employing two or more sheets of conductor-carrying material laid between non-conductor carrying layers with the conductors of separate layers extending in separate planes and in the desired relative directions.

The glass reinforcing fibers add high strength to the panelboards. They also serve the additional function of providing a carrier for forming the resinous material in sheet form. Other reinforcing materials may be likewise employed, for example synthetic materials such as fibrous cellulose acetate, polyamid resins, polyester resins, etc.; or reinforcing fibers may be employed in other forms, such as in the form of woven cloth, nonwoven mats, etc.

In the present example, the resinous material employed was of a solid stable heat-curable nature after the layers of sheet material were formed. Upon being subjected to heat and pressure after the composite panelboard structure was formed, the resin was readily cured to a hard firm state. Other thermosetting resin compositions, e.g. organic silicon resins, alkyd resins, phenolic resins, etc., may also be employed in making my circuit panelboard. However, the resinous material need not be limited to thermosetting type resins, resins of a thermoplastic nature also being highly suitable. Nor need the resinous material be employed exclusively in reinforced sheet form. The following example is illustrative of panelboards formed using non-reinforced thermoplastic sheets as the resinous material from which the resinous panel is formed.

*Example II*

A laminar structure was laid up as described in the previous example employing, as the insulating sheet material, 11 layers of unfused polytetrafluoroethylene film, each having a thickness of 10 mils. Five layers of the film were employed between the two series of conductors with 3 layers being positioned on each side thereof. Aluminum foil having a thickness of 5 mils was placed on each side of the formed laminar structure and the structure was then pressed between platens at a pressure of about 1,000 pounds per square inch at room temperature for a period of about one minute. Pressure was then released and the pressed structure removed from the press. It was then unified by immersion in a hot salt melt having a temperature of 685–690° F. for about 6½–7 minutes while being held between ¼ inch steel plates, during which time the polytetrafluoroethylene became fused. The clamped assembly was then quenched in cold water after which the panel-structure was removed and cut into panelboards of the desired sizes.

The resulting panelboards having a thickness of about 3/32 inch were found to be highly satisfactory in every respect when employed as electrical circuit panelboards. Long lasting conductive connections between conductors were effected in the completed panelboard both by insertion of preformed connectors as above described and by introduction of solder in making operative electrical circuits. The panels were sufficiently transparent to permit the position of the conductors to be easily ascertained.

Thermoplastic type resins other than the polytetrafluoroethylene of the present example may be employed in forming the structures of the present invention. However, where a thermoplastic resin is employed, it should have a melting or softening point at least above the highest temperature to which the panelboard is to be subjected either during subsequent operations to be performed thereon, e.g., immersion in a molten solder-bath, or during use.

*Example III*

A woven mesh member (of the plain weave type shown in FIGURE 6) was first formed. The screen was formed of cotton and enamel insulated copper magnet wires (AWG No. 26). A first series of the wires spaced in parallel on 0.10 inch centers were interwoven with a second series of the wires also spaced on 0.10 inch centers in a plain weave according to known screen forming procedures. The mesh member, of a handleable nature permitting it to be rolled, cut, etc. without displacement of the conductors, was then laid between six layers (three on each side of the mesh member) of the uncured reinforced sheet material described in Example 1 and the composite thus formed was subjected to heat and pressure under the conditions described to cure the resinous material. The resulting panelboard provided a highly suitable electrical circuit panelboard in which the objects and advantages set forth herein are attained in all respects. The process is particularly desirable in providing means for continuous manufacture of the panelboard product in any desired length.

In the embodiments disclosed specifically herein, the conductors of one series cross the conductors of the other series at an angle of 90 degrees. It is apparent that electrical circuit panelboards wherein the crossing conductors form an angle other than 90 degrees may also be employed with highly satisfactory results. Conductors of the respective series may be spaced at different distances or the spacing between conductors of the same series may differ; although, in the interest of standardization I prefer to have equal spacing between conductors. Nor need the series of crossing conductors in my panelboard be limited to two, additional series being desirable in some instances where highly complex circuits are to be employed. These and other structures, coming within the spirit of my invention, are contemplated by me, it being intended that my invention be limited only by the scope of the appended claims.

What is claimed is as follows:

1. A unitary internal-conductor electrical circuit panelboard having a vast number of potential circuit layouts, one or more of which may be simply and conveniently made operative, and in which an operative layout may be simply and conveniently altered; said panelboard comprising a unified hardened insulating panel the major surfaces of which are substantially continuous and uninterrupted, said panel having a preformed woven mesh member embedded therein and indisplaceably retained thereby, said mesh member comprising a first series of elongate conductors disposed in parallel predetermined spaced relationship and a second series of elongate conductors disposed in parallel predetermined spaced relationship, conductors of said first series being interwoven with and insulated from conductors of said second series, said panelboard being adapted to the conductive connection of conductors at points of crossing and to the severance of conductors, as desired, to thereby determine a selected circuit.

2. A unitary electrical internal-conductor circuit panelboard having a vast number of potential circuit layouts, one or more of which may be simply and conveniently made operative, and in which an operative layout may be simply and conveniently altered; said panelboard comprising a unified panel, the major surfaces of said panel being substantially continuous and uninterrupted, a first series of elongate conductors disposed in parallel predetermined spaced relation indisplaceably embedded within and extending across said panel and a second series of elongate conductors disposed in parallel predetermined spaced relationship indisplaceably embedded within and extending across said panel at an angle with respect to conductors of said first series so as to cross the latter, the conductors of said first series being normally insulated from conductors of said second series, said panel comprising a cured epoxide resin composition reinforced throughout with lineally aligned contiguous glass filaments, said panelboard being adapted to the conductive connection of conductors at points of crossing and to the severance of conductors, as desired, to thereby determine a selected circuit.

3. For use in a unitary internal-conductor electrical circuit panelboard having a vast number of potential circuit layouts, a reinforced conductor-carrying lamina comprising a thin solid sheet of flowable heat-curable resinous material, contiguous aligned strands of glass filaments embedded in said sheet and a series of elongate conductors disposed in parallel predetermined spaced relation embedded in said sheet amongst said strands and extending parallel with the latter, said strands being substantially evenly distributed between the conductors.

4. The lamina of claim 3 wherein the resinous material is an epoxide resin composition.

5. For use in a unitary internal-conductor electrical circuit panelboard having a vast number of potential circuit layouts, a reinforced conductor-carrying lamina comprising a thin solid sheet of thermoplastic resinous material, contiguous aligned strands of glass filaments embedded in said sheet and a series of elongate conductors disposed in parallel predetermined spaced relation embedded in said sheet amongst said strands and extending parallel with the latter, said strands being substantially evenly distributed between the conductors.

6. A unitary electrical internal-conductor circuit panelboard having a vast number of potential circuit layouts, one or more of which may be simply and conveniently made operative, and in which an operative layout may be simply and conveniently altered; said panelboard comprising a unified hardened resinous insulating panel, the major surfaces of said panel being substantially continuous and uninterrupted, a first series of elongate conductors disposed in parallel predetermined spaced relation indisplaceably embedded within and extending across said panel and a second series of elongate conductors disposed in parallel predetermined spaced relationship indisplaceably embedded within and extending across said panel at an angle with respect to conductors of said first series so as to cross the latter, the conductors of said first series being insulated from conductors of said second series, said panelboard being adapted to the conductive connection of conductors at points of crossing and to the severance of conductors, as desired, to thereby determine a selected circuit.

References Cited in the file of this patent

UNITED STATES PATENTS

| | | |
|---|---|---|
| 94,601 | Heywood | Sept. 7, 1869 |
| 2,019,625 | O'Brien | Nov. 5, 1935 |
| 2,169,408 | De Vellier | Aug. 15, 1939 |
| 2,353,001 | Ambruster | July 4, 1944 |
| 2,459,653 | Keyes | Jan. 18, 1949 |
| 2,569,920 | Buck | Oct. 2, 1951 |
| 2,613,252 | Heibel | Oct. 7, 1952 |
| 2,613,287 | Geiger | Oct. 7, 1952 |
| 2,623,087 | Latta | Dec. 23, 1952 |
| 2,626,223 | Sattler et al. | Jan. 20, 1953 |
| 2,883,447 | Dahl | Apr. 21, 1959 |

FOREIGN PATENTS

| | | |
|---|---|---|
| 625,051 | Great Britain | June 21, 1949 |

OTHER REFERENCES

Maisch: "Electronic Design," December 1954, page 29. (Copy in Scientific Library.)